(12) United States Patent
Buxbaum et al.

(10) Patent No.: US 7,244,334 B2
(45) Date of Patent: Jul. 17, 2007

(54) APPARATUS USED IN RESHAPING A SURFACE OF A PHOTORESIST

(75) Inventors: Alex Buxbaum, Portland, OR (US); Melvin W. Montgomery, Camas, WA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/183,045

(22) Filed: Jul. 15, 2005

(65) Prior Publication Data

US 2005/0250023 A1 Nov. 10, 2005

Related U.S. Application Data

(62) Division of application No. 10/395,773, filed on Mar. 24, 2003, now Pat. No. 6,931,619, which is a division of application No. 09/811,186, filed on Mar. 16, 2001, now Pat. No. 6,582,861.

(51) Int. Cl.
*H05H 1/00* (2006.01)
*G03F 1/00* (2006.01)

(52) U.S. Cl. .................................. 156/345.24; 430/30

(58) Field of Classification Search .............. 430/5, 430/30; 216/51, 79; 438/719; 156/345.28, 156/345.47
See application file for complete search history.

(56) References Cited

U.S. PATENT DOCUMENTS

| | | | |
|---|---|---|---|
| 4,326,911 A | 4/1982 | Howard et al. ............. | 156/643 |
| 4,557,797 A | 12/1985 | Fuller et al. ................ | 156/643 |
| 5,023,164 A | 6/1991 | Brunsvold et al. .......... | 430/270 |
| 5,237,037 A | 8/1993 | Ebersole .................... | 528/153 |
| 5,324,620 A | 6/1994 | Ebersole .................... | 430/192 |
| 5,346,799 A | 9/1994 | Jeffries, III et al. ........ | 430/192 |
| 5,541,033 A | 7/1996 | Blakeney et al. ........... | 430/192 |
| 5,547,814 A | 8/1996 | Blakeney et al. ........... | 430/326 |
| 5,554,485 A | 9/1996 | Dichiara et al. ......... | 430/271.1 |
| 5,585,012 A | 12/1996 | Wu et al. ..................... | 216/71 |
| 5,602,260 A | 2/1997 | Blakeney et al. ........... | 549/362 |

(Continued)

FOREIGN PATENT DOCUMENTS

EP 0840361 5/1998

(Continued)

*Primary Examiner*—S. Rosasco
(74) *Attorney, Agent, or Firm*—Shirley L. Church

(57) ABSTRACT

The invention relates to a method of improving control over the dimensions of a patterned photoresist, which enables better control of the critical dimensions of a photomask or reticle which is fabricated using the patterned photoresist. In addition, the method may be used to enable improved control over the dimensions of a semiconductor device fabricated using a patterned photoresist. In particular, a patterned photoresist is treated with an etchant plasma to reshape the surface of the patterned photoresist, where reshaping includes the removal of "t"-topping at the upper surface of the patterned resist, the removal of standing waves present on patterned surfaces, and the removal of feet which may be present at the base of the patterned photoresist, where the photoresist contacts an underlying layer such as an ARC layer. The method is particularly useful for chemically amplified DUV photoresists, where the presence of "t"-topping, standing waves and foot formation is accentuated in the patterned photoresist as developed.

11 Claims, 4 Drawing Sheets

U.S. PATENT DOCUMENTS

| | | | |
|---|---|---|---|
| 5,667,650 A | 9/1997 | Face et al. | 204/298.07 |
| 5,891,350 A | 4/1999 | Shan et al. | 216/71 |
| 5,964,949 A | 10/1999 | Savas | 118/723.1 |
| 5,980,768 A | 11/1999 | Abraham | 216/67 |
| 6,066,578 A | 5/2000 | Gupta et al. | 438/790 |
| 6,078,738 A | 6/2000 | Garza et al. | 395/500.22 |
| 6,146,793 A | 11/2000 | Schaedeli et al. | 430/18 |
| 6,159,863 A | 12/2000 | Chen et al. | 438/720 |
| 6,180,316 B1 | 1/2001 | Kajita et al. | 430/270.1 |
| 6,235,643 B1 * | 5/2001 | Mui et al. | 438/719 |
| 6,277,750 B1 | 8/2001 | Pawlowski et al. | 438/689 |
| 6,316,167 B1 | 11/2001 | Angelopolous et al. | 430/313 |
| 6,326,618 B1 * | 12/2001 | Kane et al. | 250/307 |
| 6,342,452 B1 | 1/2002 | Coronel et al. | 438/710 |
| 6,423,644 B1 | 7/2002 | Nallan et al. | 438/714 |
| 6,468,915 B1 | 10/2002 | Liu | 438/706 |
| 6,518,206 B1 | 2/2003 | Kumar et al. | 438/952 |

FOREIGN PATENT DOCUMENTS

| | | |
|---|---|---|
| GB | 2302759 | 1/1997 |
| WO | WO 00/31782 | 6/2000 |

* cited by examiner

US 7,244,334 B2

APPARATUS USED IN RESHAPING A SURFACE OF A PHOTORESIST

This application is a divisional application of U.S. application Ser. No. 10/395,773, filed Mar. 24, 2003, which is now U.S. Pat. No. 6,931,619, which is a divisional application of application Ser. No. 09/811,186, filed Mar. 16, 2001, which issued as U.S. Pat. No. 6,582,861, on Jun. 24, 2003.

BACKGROUND OF THE INVENTION

1. Field of the Invention

In general, the present invention relates to a method of reshaping a patterned photoresist. The surface of the patterned photoresist material is "trimmed" and "refinished", to improve the pattern profile and surface finish of the patterned photoresist. The method is particularly useful in the preparation of reticles which are used in combination with an exposure tool to image photoresist layers overlying a semiconductor substrate. The method may also be used to prepare a photoresist masking layer which is used to transfer a pattern to an underlying hard masking material on a semiconductor substrate. The method is useful for reshaping patterned i-line photoresists and is particularly beneficial when the patterned photoresist is a deep ultra violet (DUV) photoresist.

2. Brief Description of the Background Art

Photoresist compositions are used in microlithographic processes for making miniaturized electronic components, such as in the fabrication of semiconductor device structures. The miniaturized electronic device structure patterns are typically created by transferring a pattern from a patterned masking layer overlying the semiconductor substrate rather than by direct write on the semiconductor substrate, because of the time economy which can be achieved by blanket processing through a patterned masking layer. With regard to semiconductor device processing, the patterned masking layer may be a patterned photoresist layer or may be a patterned "hard" masking layer (typically an inorganic material or a high temperature organic material) which resides on the surface of the semiconductor device structure to be patterned. The patterned masking layer is typically created using another mask which is frequently referred to as a photomask or reticle. A reticle is typically a thin layer of a chrome-containing material deposited on a glass or quartz plate. The reticle is patterned to contain a "hard copy" of the individual device structure pattern to be recreated on the masking layer overlying a semiconductor structure.

A reticle may be created by a number of different techniques, depending on the method of writing the pattern on the reticle. Due to the dimensional requirements of today's semiconductor structures, the writing method is generally with a laser or e-beam. A typical process for forming a reticle may include: providing a glass or quartz plate, depositing a chrome-containing layer on the glass or quartz surface, depositing an antireflective coating (ARC) over the chrome-containing layer, applying a photoresist layer over the ARC layer, direct writing on the photoresist layer to form a desired pattern, developing the pattern in the photoresist layer, etching the pattern into the chrome layer, and removing the residual photoresist layer. When the area of the photoresist layer contacted by the writing radiation becomes easier to remove during development, the photoresist is referred to as a positive-working photoresist. When the area of the photoresist layer contacted by the writing radiation material becomes more difficult to remove during development, the photoresist is referred to as a negative-working photoresist. Advanced reticle manufacturing materials frequently include layers of chromium, chromium oxide, and chromium oxynitride. The photoresist layer upon which the direct writing is carried out is frequently a chemically amplified DUV photoresist material today, because of pattern dimensional requirements.

A patterned chemically amplified DUV photoresist layer frequently exhibits a "foot" at the bottom of the pattern profile, where the photoresist layer interfaces with an underlying ARC layer on the chrome-containing surface. Some developed photoresists exhibit a "t"-top profile. In addition, the surface of the patterned photoresist layer typically exhibits standing waves, due to reflections which occur during the direct writing on the photoresist layer, despite the presence of the underlying ARC layer.

To provide a photomask or reticle capable of accurately producing critical dimensions of 0.15 µm or smaller, it is highly desirable to trim and resurface (reshape) the patterned DUV photoresist to remove a foot, a t-top, or standing waves remaining after patterning.

FIG. 1A shows a schematic of a cross-sectional view of a typical starting structure 100 used to form a reticle, including, from bottom to top, a quartz substrate 102, overlaid with chrome-containing layer 104, overlaid with an ARC layer 106, and a photoresist layer 108. As shown in FIGS. 1B and 1C, after patterning of the photoresist layer 108, there is often a "foot" 110 extending from the lower portion of patterned photoresist layer 108 toward the surface 116 of ARC layer 106. The presence of a foot (feet) 110 makes it difficult to maintain control of the critical dimensions during subsequent etch transferring of the photoresist pattern through the ARC layer 106 and chrome containing layer 104. The foot also impacts the metrology capabilities of the lithographer.

FIG. 1C, which is an enlargement (from FIG. 1B) of a portion of the patterned photoresist layer 108 (with underlying ARC layer 106), shows a line 107 which exhibits "t"-topping 113 in the upper portion of line 107, feet 110 at the base of line 107, and ripples (standing waves) 114 on the sidewall 111 surfaces 112 of line 107. The "t"-topping 113 is believed to be caused by contamination/reaction which occurs at the upper surface of the photoresist layer during processing prior to development of the pattern. The standing waves 114 are generated by reflected radiation within the photoresist material, which occurs during the direct writing of the pattern into photoresist layer 108. The ARC layer 106 helps reduce the standing wave effect by reducing reflection back from underlying layers and device features into the photoresist layer 108, but standing waves are generated in varying degrees depending on the imaging system and the material composition of the particular photoresist. When the photoresist is a chemically amplified photoresist, transparency of the photoresist material is particularly high throughout the entire direct writing process; this results in increased reflectivity (greater than that for earlier i-line novolak photoresists), which increases the formation of standing waves 114.

Since most photoresists are comprised of organic materials, a plasma formed from oxygen ($O_2$) gas has been used to remove residual photoresist material remaining on the exposed surface 118 of ARC layer 106 after photoresist patterning. This cleaning of the exposed surface 118 of ARC layer 106 is frequently referred to as "descumming", since a scum of residual organic material remains over surface 118 after patterning of photoresist layer 108. A small reduction in the size of feet 110 may occur during the descumming process. However, since a plasma formed from $O_2$ gas tends to be isotropic in nature, the feet 110 are not removed completely. Or, if the feet 110 are totally removed, this frequently causes a change in the critical dimension (an enlargement in the opened area of the photoresist) of the pattern in patterned photoresist layer 108 by the time the feet 110 are removed.

It would be desirable to provide an effective process for reshaping the patterned photoresist, which process removes the feet at the base of patterned sidewalls and removes the ripples (standing waves) from sidewall surfaces while enabling the control of the photoresist critical pattern dimensions.

SUMMARY OF THE INVENTION

One embodiment of the present invention pertains to a method of selectively reshaping the surface of a patterned photoresist. This method includes providing a patterned photoresist layer overlying a layer of antireflective material, accelerating oxygen-comprising species with directionality normal to a surface of the patterned photoresist, and applying the oxygen-comprising species to the surface of the patterned photoresist until the surface is reshaped (to remove standing waves and to remove at least a portion of a foot present at an interface between the patterned photoresist and the layer of antireflective material). The method is particularly useful when a chemically amplified photoresist is used and when a chemically amplified DUV photoresist is used.

Another embodiment of the invention pertains to a method of fabricating a photomask or reticle. This method includes: Providing a stack of layers including, from top to bottom, a layer of patterned photoresist, at least one layer of antireflective material, at least one layer of a chrome-containing material, and a silicon oxide-containing substrate; accelerating oxygen-comprising species toward a surface of the patterned photoresist to reshape the surface, by removing standing waves and by removing at least a portion of a foot which is present at an interface between the photoresist and the layer of antireflective material; transferring a pattern from the reshaped photoresist through the layer of antireflective material; and transferring the pattern through the chrome-containing material to a surface of the silicon oxide-containing substrate. The method is particularly useful when a chemically amplified photoresist is used, and when a chemically amplified DUV photoresist is used.

It is difficult to do the metrology which indicates whether a patterned photoresist will provide a desired reticle critical dimension when a foot is present at the base of the patterned photoresist. The metrology is particularly inaccurate since the size of the foot typically varies at different locations across the reticle fabrication structure. Metrology may be carried out after patterning of the photoresist or may be carried out after the pattern has been transferred through the chrome-containing masking layer. The significant cost of transferring a defective pattern from a patterned photoresist through several underlying layers to form the reticle can be avoided by conducting metrology for the reticle after patterning of the photoresist (rather than after patterning of the underlying chrome-containing masking layer).

Reshaping of the surface of a patterned photoresist, to remove standing waves from the patterned surface and to remove a foot present at the base of the patterned photoresist and/or a "t"-top from the upper surface of the patterned resist, aids in the creation of the desired mask structural profile (improved pattern resolution), which enables better pattern transfer to a semiconductor device. In addition, the reshaping makes it possible to accurately conduct metrology after patterning of the photoresist, which provides a substantial savings in terms of mask production costs.

BRIEF DESCRIPTION OF THE DRAWINGS

FIG. 1A shows a schematic cross-sectional view of beginning structure 100 of a stack of materials used in the production of a photomask or reticle. The stack from bottom to top includes a substrate 102 which is typically selected from quartz, fluorinated quartz, borosilicate glass, or soda lime glass; a chrome-containing layer 104; an inorganic ARC layer such as chrome oxynitride, titanium nitride or silicon nitride 106; a chrome-containing layer 104; and a DUV photoresist layer 108. An organic ARC layer may also be used, alone (as layer 106) or in combination with an inorganic ARC layer 106, where the organic ARC overlies inorganic ARC layer 106. The organic ARC is selected from materials such as poly(vinyl pyridine), polyimide, or a negative photoresist material containing a DUV dye. Examples of organic ARCs are provided in U.S. Pat. Nos. 4,357,416; 4,102,683; and 5,278,010.

FIG. 1B shows the FIG. 1A structure after a direct write patterning of DUV photoresist layer 108 using a laser or e-beam. A pattern of lines and spaces has been created in DUV photoresist layer 108. The upper portion of each line 107 exhibits a "t" top 113, has at its base a foot 110 which is in contact with the upper surface 118 of ARC layer 106, and exhibits standing waves 114 (not shown in FIG. 1B, but shown in FIG. 1C).

FIG. 1C shows an enlargement of a portion of FIG. 1B, which shows the details of line 107, including the "t" top 113, the feet 110, and ripples/standing waves 114 on the surface 112 of sidewalls 111 of line 107.

DETAILED DESCRIPTION OF THE INVENTION

Figure 1A:
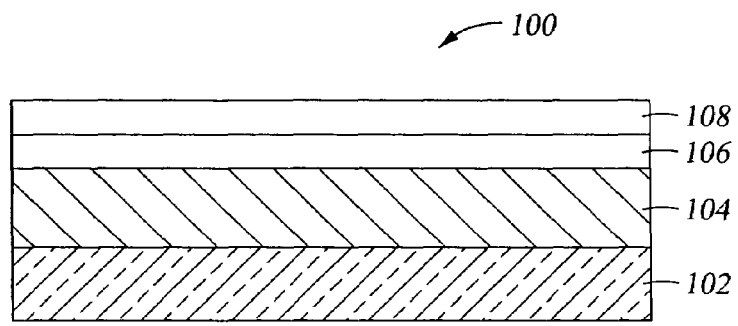
FIGS. 1A-1C illustrate problems encountered in the direct writing of a pattern into a photoresist material.

As a preface to the detailed description, it should be noted that, as used in this specification and the appended claims, the singular forms "a", "an", and "the" include plural referents, unless the context clearly dictates otherwise. All percentages (%) listed for gas constituents are % by volume, unless otherwise indicated.

As mentioned in the Background Art section above, reflections from underlying materials frequently create standing waves on the surface of a patterned photoresist. Further, due to chemical reactions which take place between the photoresist and a layer underlying the photoresist, undeveloped areas may occur at the base of a patterned photoresist (these undeveloped areas are commonly referred to as a foot or as feet). As mentioned in the Background Art section, the presence of standing waves and feet on the surface of a patterned photoresist affects the critical dimensions of a semiconductor device or a photomask which is produced using the patterned photoresist to transfer a pattern into the surface of the semiconductor device or photomask.

When the photoresist is a chemically amplified photoresist, such as a DUV photoresist, the t-topping and standing wave problems are magnified. In addition, chemically amplified photoresists typically exhibit an increased problem in the area of foot formation. FIG. 1C illustrates a schematic of a cross-sectional view of a line 107 in a patterned photoresist 108 which exhibits "t"-topping 113, standing waves 114 on sidewall 111 surfaces 112, and feet 110 at the base. We have discovered a method of reshaping the surfaces 112 of a patterned photoresist such as line 107 to remove "t"-topping 113, standing waves 114, and at least a portion (preferably all) of feet 110, while leaving at least the underlying glass or quartz substrate essentially unaffected so that its performance is not impaired.

I. Apparatus for Practicing the Invention

The method of the invention is typically carried out in a plasma etching apparatus that is capable of enabling anisotropic etching. The Examples described below were carried out in an inductively coupled plasma (ICP) etch processing chamber, a Plasma-Therm VLR (available from Plasma-Therm, Inc., Saint Petersburg Fla.). However, other plasma etch systems such as the Applied Materials, Inc. CENTURA® DPS™ etch system (available from Applied Materials, Inc. of Santa Clara Calif.) may be used to provide excellent results. A plasma processing system which permits separate power application for plasma generation and for substrate biasing is commonly referred to as a Decoupled Plasma Source (DPS). Substrate biasing is used to attract ions and other high energy species from the plasma toward the substrate surface, enabling anisotropic etching. Separate application of power for plasma generation and power for substrate biasing permits separate control of the plasma density and the attractive forces (DC voltage) generated on the surface of the substrate.

A description of an apparatus including a Decoupled Plasma Source (DPS) is provided by Yan Ye et al. from the Proceedings of the Eleventh International Symposium of Plasma Processing (May 7, 1996) which was published in the Electrochemical Society Proceedings (Volume 96-12, pp. 222-233, 1996), which is hereby incorporated by reference. U.S. Pat. No. 5,753,044 issued to Hanawa et al. on May 19, 1998 contains a general description of an RF plasma reactor of the kind which permits separate power application and control for plasma generation and maintenance and for substrate biasing, by way of example and not by way of limitation.

Figure 4:
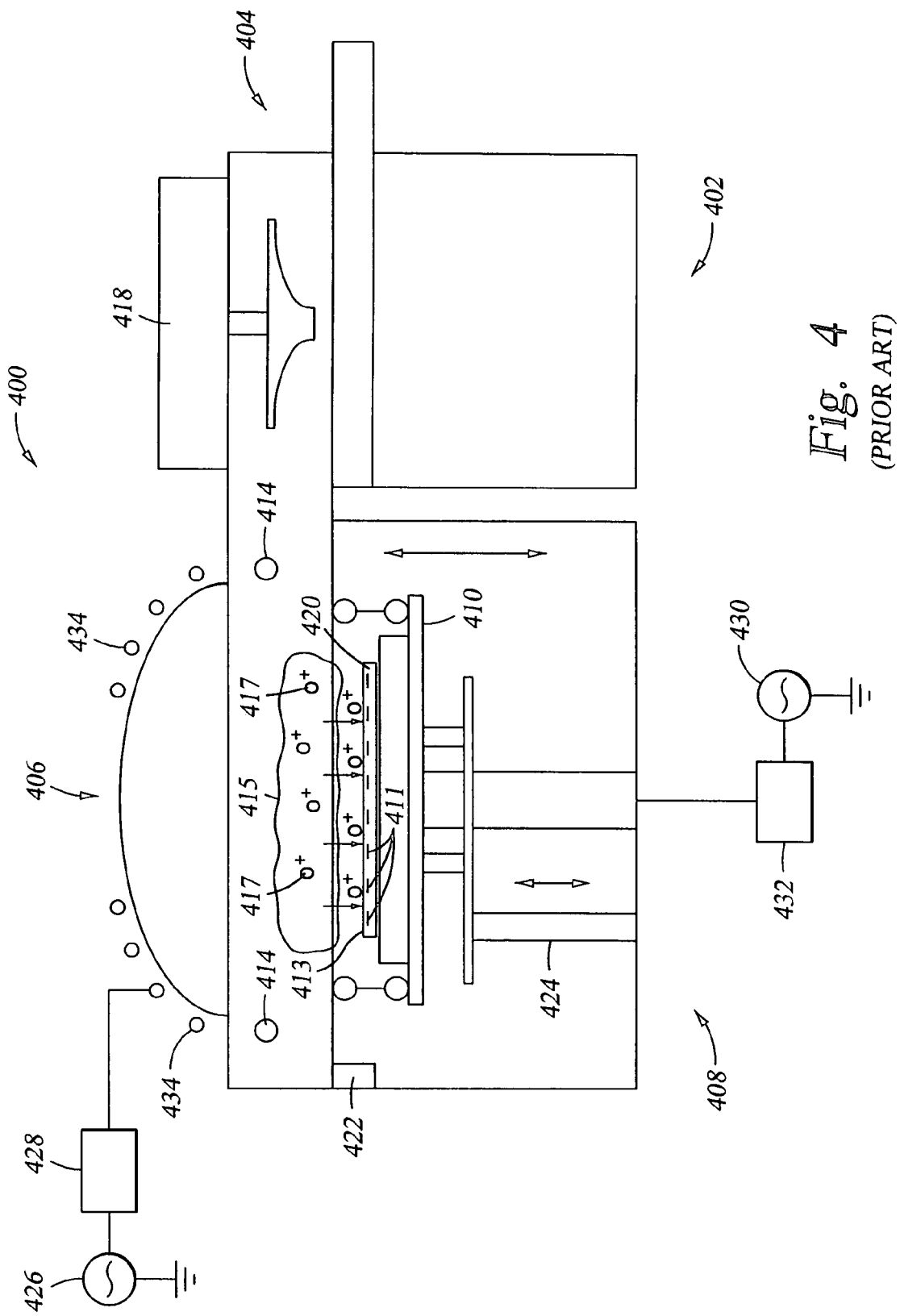
FIG. 4 shows a schematic of one kind of processing apparatus 400 in which the method of the present invention may be carried out.

FIG. 4 shows a schematic of a side view of an individual CENTURA® DPS™ etch chamber 400. The etch chamber 400 consists of an upper chamber 404 having a ceramic dome 406, and a lower chamber 408. The lower chamber 408 includes a monopolar electrostatic chuck (ESC) cathode 410. Gas is introduced into the chamber via gas injection nozzles 414 for uniform gas distribution. Chamber pressure is controlled by a closed-loop pressure control system (not shown) using a throttle valve 418. During processing, a substrate 420 is positioned on the surface of a cathode 410. The cathode 410 and substrate 420 are then raised by means of a substrate lift 424 and sealed against the upper chamber 404 in position for processing. Etch gases are introduced into the upper chamber 404 via gas injection nozzles 414. The etch chamber 400 includes a plasma source power 426 and matching network 428 which is used to apply power to inductive coil 434 when inductive coil 434 is used to generate and sustain a plasma. An RF bias power 430 with matching network 432 is used to apply power to the cathode 410 beneath substrate 420. Power applied to cathode 410 creates a substrate bias in the form of a negative voltage 411 on the upper surface 413 of substrate 420. This negative voltage 411 may be used to attract ions from a plasma formed in chamber 400 to the upper surface 413 of substrate 420. Plasma source power 426 and substrate biasing means 430 are controlled by separate controllers (not shown).

In the Examples described herein, the power applied to cathode 410 was used both to produce a plasma 415 and to form a negative voltage 411 on the upper surface 413 of substrate 420. No plasma source power was applied to inductive coil 434.

II. A Method of Reshaping a Patterned Organic Photoresist Surface

Although the method of the invention may be applied to the reshaping of a patterned photoresist overlying a semiconductor substrate, as previously described, one of the most advantageous uses of the method is in the fabrication a photomasks or reticles. The method is described below with reference to photomasks or reticles, but the invention is not intended to be limited to this application, since one skilled in the art can extend the teachings of the invention to the reshaping of patterned photoresists during semiconductor device fabrication.

All patterned organic photoresists may benefit from application of the reshaping method, including i-line photoresists which are well known in the semiconductor industry. Patterned i-line photoresists which are imaged using an ALTA™ 3700 imaging system (available from ETEC Systems, Inc. of Hillsboro, Oreg.) are easily reshaped using the present method. In addition, the method is particularly useful for chemically amplified photoresists of the kind generally used in DUV lithography, and therefore the present Examples are for a chemically amplified photoresist. However, the scope of the invention is not intended to be limited to chemically amplified photoresists.

EXAMPLES

Example One

FIG. 1A shows a typical starting structure 100 used in the fabrication of a photomask, hereafter referred to as a reticle. In this Example, starting structure 110 was a stack of layers which included, from top to bottom, a 5,000 Å thick layer of a chemically amplified DUV photoresist, DX1100 (available from AZ Clariant Corp. of Somerville, N.J.); a 250 Å thick layer of an inorganic ARC, chrome oxynitride; a 750 Å thick layer of a mask material which is essentially chrome; and a silicon oxide-containing substrate.

In particular, the chemically amplified DUV photoresist comprises propylene glycol monomethyl; ether acetate; PMA; PGMEA; 1-methoxy-2-propyl acetate; modified phenolic polymer; and an onium salt metal halide complex as a chemical amplifier. The inorganic ARC was $CrO_xN_y$. The chrome-containing mask material was essentially chrome. The silicon oxide-containing substrate was quartz.

Figure 1B:
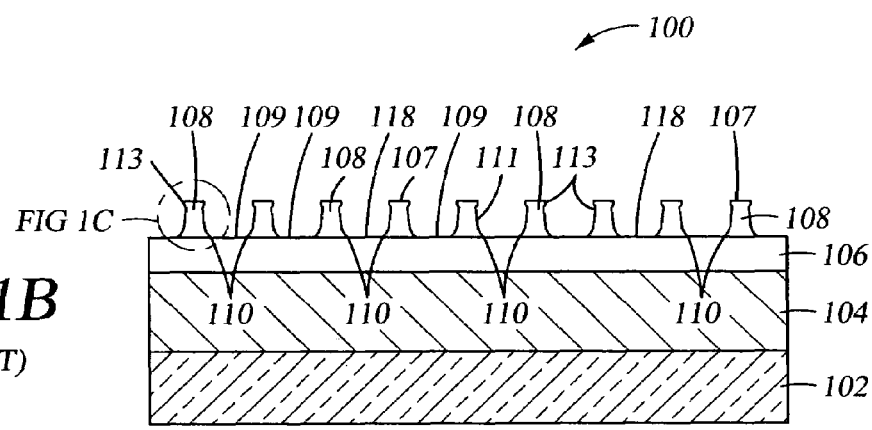
Figure 1C:
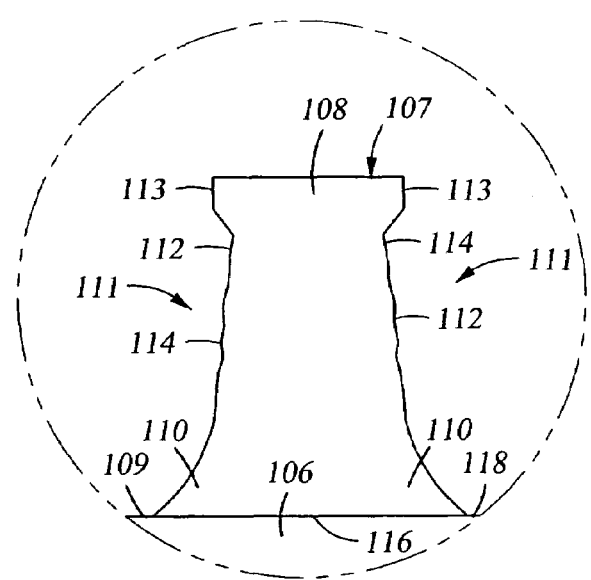

FIG. 1B shows a schematic cross-sectional view of the patterned photoresist layer 108, where the pattern was lines 107 and spaces 109, where the line width was about 0.30 μm and the spacing between lines was about 0.5 μm. The patterning was done using a direct write continuous laser, in particular, a 257 nm mask writing laser tool available from ETEC Systems Inc., Hillsboro, Oreg. This 257 nm laser tool, available under the trade name ALTA™, is a raster-scan writing system. The system contains a polygon that rotates, reflecting 32 laser beams off each facet, and scans the beams (referred to as the brush) across the substrate. The writing quality specifications for the 257 nm ALTA™ mask writing laser tool include a minimum feature size of about 400 nm. However, while the 257 nm ALTA™ mask writing laser tool provides the user with advanced feature critical dimension (CD) control, linearity, and uniformity, realization of the complete performance potential in the fabricated mask depends on the use of appropriate process materials and processing methods during fabrication of the mask.

FIG. 1C shows a close-up of a typical line 107 of a patterned photoresist layer 108 used to provide pattern transfer to a mask during fabrication, prior to the present invention. FIG. 1C illustrates a "t" topping 113 at the upper portion of line 107, the standing waves 114 on sidewall 111 surfaces 112, and the foot 110 which occurs at the base of sidewall 111. As previously mentioned, the "t"-topping is believed to be caused by surface contamination of the photoresist during processing prior to pattern development. The standing waves 114 are attributed to reflectivity from the underlying chrome layer 104 which occurred during the direct write of the lines and spaces pattern on photoresist layer 108, despite the presence of ARC layer 106. The foot 110 is attributed to neutralization of an acid (formed in photoresist layer 108 during the direct write process) by the basicity of the underlying inorganic ARC layer. This acid is needed to facilitate removal of the photoresist material during the development process. The "t" topping 113, standing waves 114, and feet 110 appeared during development of the photoresist layer using a 2.38 weight % tetramethyl ammonium hydroxide solution which is generally known in the art.

Figure 2A:
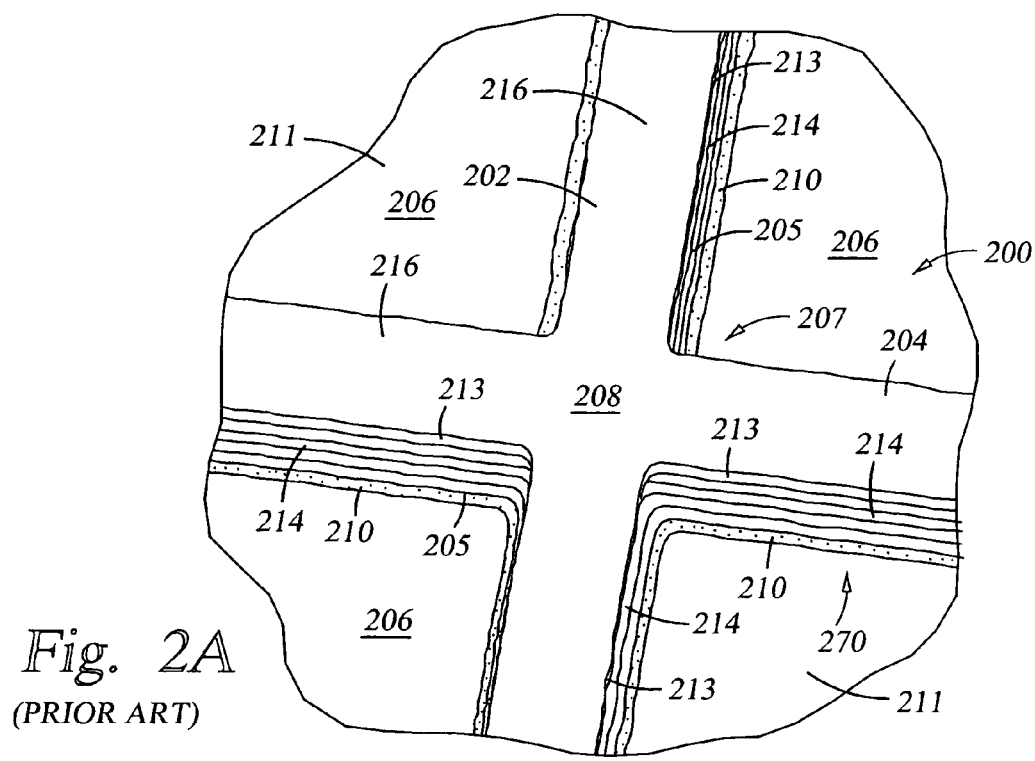
FIG. 2A shows a schematic of a top view of an intersecting line pattern 200 observed from a photomicrograph of a direct write pattern in a chemically amplified DUV photoresist 208. The exposed ARC layer 206 lies beneath patterned photoresist layer 208, which exhibits residual feet 210, a "t" top 213, and standing waves 214 which are clearly visible beneath the upper surface 205 (and "t" top 213) of the intersecting lines 202 and 204.
Figure 2B:
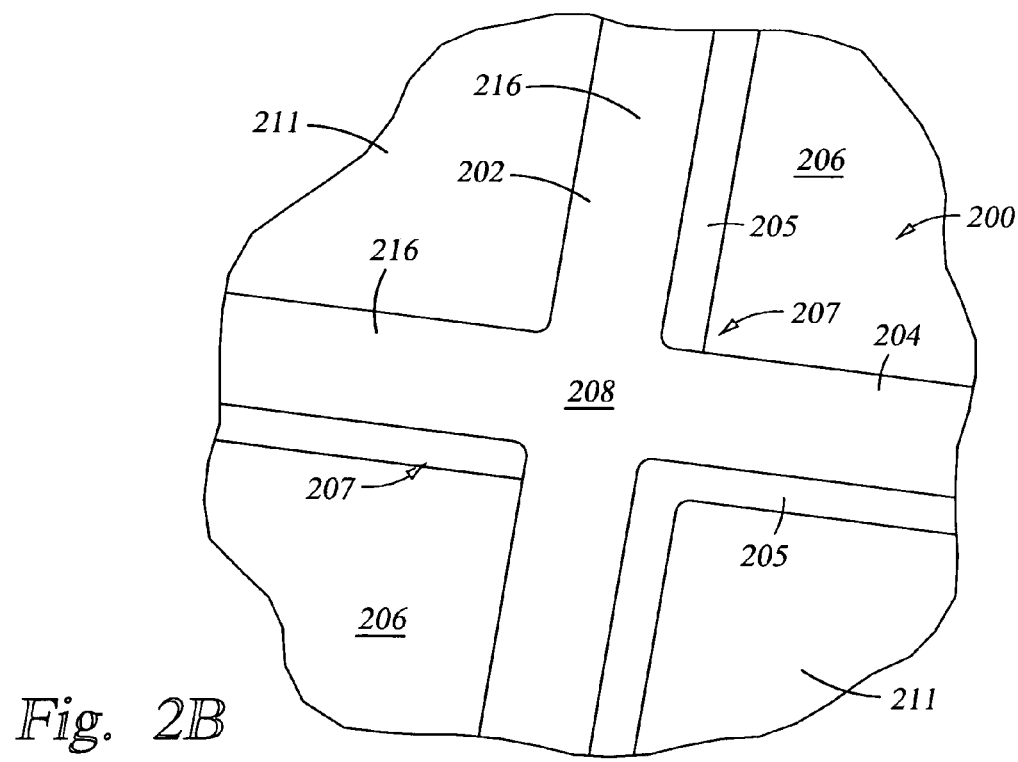
FIG. 2B shows the schematic top view of the intersecting line pattern 200 shown in FIG. 2A after application of the method of the present invention to shape the surface 205 of the patterned photoresist 208. During reshaping of the surface 205, "t" top 213, standing waves 214 and feet 210 have been removed from the surface 205.

FIG. 2A shows a schematic of a top view of a pattern of intersecting lines 202 and 204, with spaces present where the patterned photoresist 208 has been developed down to the surface of the ARC layer 206. The "t" topping 213, standing waves 214 on patterned surface 205, and feet 210 correspond with the "t" topping 113, standing waves 114, and feet 110 shown in FIG. 1C.

The photoresist supplier had recommended a descumming process for removing residual photoresist on the upper surface 211 of ARC layer 206. However, after carrying out the descumming process, we discovered that although residual photoresist was generally removed from the upper surface 211 of ARC layer 206, lines 202 and 204 still exhibited "t" topping 213, standing waves 214, and feet 210.

We discovered it was possible to reshape the overall surface of the patterned photoresist 208 to remove "t" topping 213, standing waves 214 and feet 210 by exposing the overall surface of patterned photoresist 208 to an oxygen comprising plasma under particular process conditions. To reshape the overall surface of patterned photoresist 208 sufficiently to remove "t" topping 213, standing waves 214 from surface 205 of sidewalls 207, and feet 210, it is typically necessary to remove at least 100 Å (preferably several hundred Å) from the overall surface of patterned photoresist 208. A desired critical dimension can be obtained after reshaping of the surface of patterned photoresist 208, as long as the reshaping is uniform across the reticle substrate, permitting a direct correlation between the dimensions of the original direct write pattern and the finished dimensions of patterned photoresist 208.

A plasma etch process is used to reshape the overall surface of patterned photoresist 208. With reference to FIG. 4, a reticle fabrication structure 420 including patterned photoresist 208 (not shown) was placed in an etch process chamber 400 of the kind shown in FIG. 4. The etch chamber 400 was evacuated to provide a chamber pressure of about 5 mTorr under etch operating conditions. A plasma source gas of oxygen was fed into etch chamber 400 at a flow rate of about 17 sccm. RF power 430 was applied to the cathode 410 beneath the reticle fabrication structure 420. Approximately 125 Watts was applied at a frequency of 13.56 MHz, to produce and maintain an oxygen-comprising plasma 415 over the surface 413 of reticle fabrication structure 420, and to provide a DC bias 411 of about −340 to −410 Volts on the surface 413; the reticle fabrication structure 420. The temperature of reticle fabrication structure 420 during reshaping of the patterned photoresist surface was about 25° C. and the temperature of the etch chamber 400 walls was about 40° C. The process time was about 60 seconds. Oxygen ions 417 from the plasma 415 were accelerated in a direction normal to the surface 413 of patterned photoresist 208 (not shown) to remove the "t"-topping 213, feet 210 and to trim off the standing waves 214 from sidewalls 207. Approximately 700 Å of thickness was removed from the upper surface 216 of lines 202 and 204 by the reshaping process. Approximately 300 Å of photoresist material was removed from the surface 205 of each exposed sidewall 207. The foot 210 was removed at the base of sidewall 207, providing an essentially vertical sidewall, forming an angle of about 88° (degrees) with the upper surface 211 of underlying ARC layer 206.

Removal of foot 210 prior to transferring the pattern to the underlying chrome layer 104 provides improved resolution in the patterned mask. This is due to the anisotropic etch of the patterned photoresist as compared with the far more isotropic etch of the underlying chrome layer 104. Removal of the foot under anisotropic etch conditions conserves pattern resolution.

Example Two

Figure 3A:
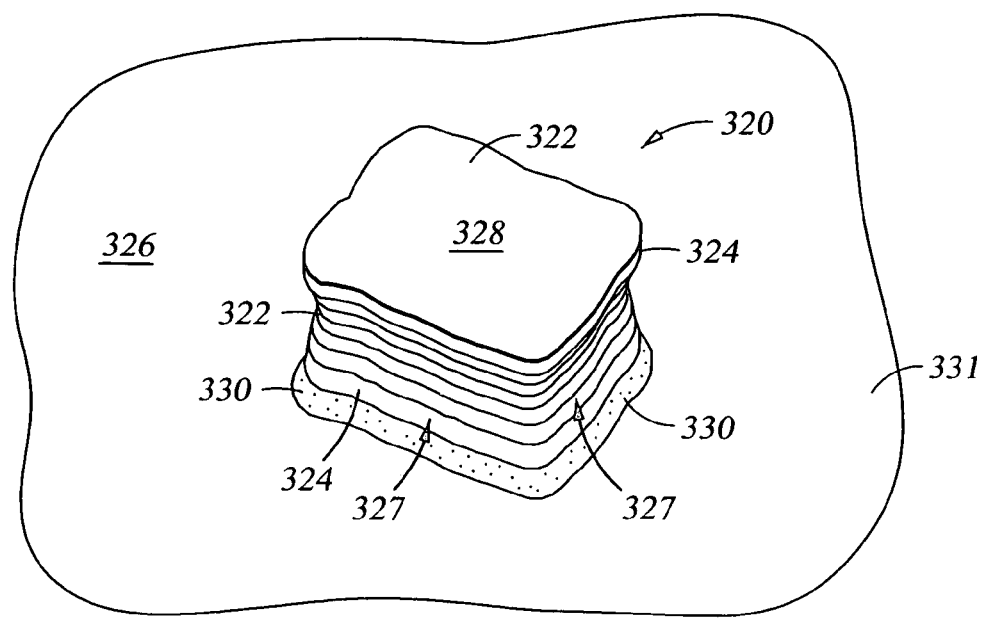
FIG. 3A shows a schematic of a top view of an isolated contact structure 320 as observed from a photomicrograph of a direct write pattern in a chemically amplified DUV photoresist 328. An exposed ARC layer 326 lies beneath the patterned photoresist 328, with residual feet 330 and standing waves 324 clearly visible in various areas on the surface 322 of the contact via structure 320.
Figure 3B:
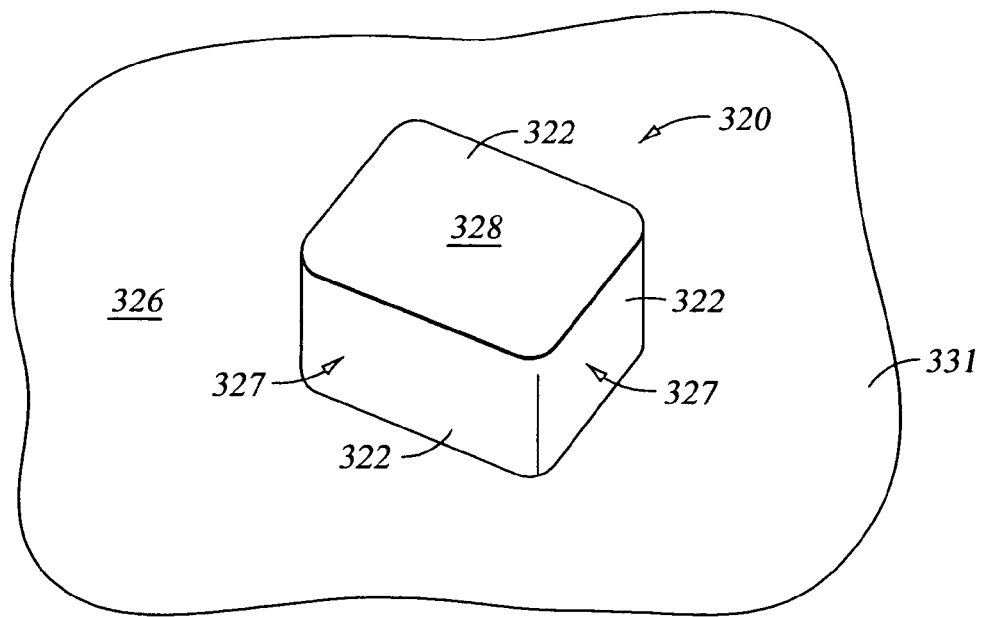
FIG. 3B shows the schematic top view of the contact structure 320 shown in FIG. 3A after application of the method of the present invention to shape the surface 322 of the patterned photoresist 328. During the reshaping of the surface 322, standing waves 324 and feet 330 have been removed from the surface 322.

FIG. 3A shows a schematic of an isolated contact pad structure taken from a photomicrograph of a patterned photoresist layer 328, where the photoresist layer 328 was patterned in the manner described with reference to Example One, above. In this Example, the starting reticle structure was the same as described above; a stack of layers which included, from top to bottom, a 5,000 Å thick layer of DUV photoresist DX1100; a 250 Å thick layer of a $CrO_xN_y$ ARC; a 750 Å thick layer of chrome masking material; and a quartz substrate. The contact pad was essentially square, having a 0.75 μm length pad. Even after descumming, the presence of standing waves 324 on the surface 322 of sidewalls 327 was evident. In addition, a substantial foot 330 was present at the base of sidewalls 327 where photoresist 328 contacted ARC layer 326.

Again, we discovered it was possible to reshape the surface 322 of the patterned photoresist 328 to remove standing waves 324 and foot 330 by exposing the surface 322 of patterned photoresist 328 to an oxygen-comprising plasma under the process conditions described above. The process time required is about 60 seconds. After removal of the foot 330, an essentially vertical sidewall 322 is achieved, forming an angle of about 88° degrees or better with the surface 331 of underlying ARC layer 326.

Example Three

The range of process conditions useful in the reshaping of a patterned photoresist surface using an oxygen-comprising plasma are as follows, for a chemically amplified DUV photoresist comprising at least one ether acetate, and a modified phenolic polymer:

TABLE I

| Process Variable | General Range of Variable | Preferred Range of Variable | Most Preferred Range of Variable |
|---|---|---|---|
| Plasma Source Gas Flow Rate ($O_2$ sccm)* | 10-200 | 10-50 | 15-19 |
| Process Chamber Pressure (mTorr) | 1-50 | 3-20 | 3-7 |
| RF Power to Cathode (W) at 13.56 MHz** | 1-500 | 100-200 | 120-130 |
| Substrate Bias (−V) | 10-750 | 200-500 | 350-400 |
| Substrate Temperature (° C.) | 5-50 | 10-30 | 12-25 |
| Process Chamber Temperature ° C. | 25-90 | 30-60 | 35-50 |
| Processing Time (sec). | 15-240 | 30-90 | 50-70 |

*An inert diluent gas such as a noble gas (He, Ar, Kr, Ne, Xe) may be used in combination with the $O_2$, where the total gas flow remains the same as that specified.
**It is contemplated that other power frequencies may be used.

One skilled in the art will recognize that the process conditions provided in Table I may need to be adjusted when the composition of the photoresist is different from that described above, or when the substrate (glass or quartz in the present instance) layer underlying the photoresist is different from that described above.

It may be necessary to adjust the processing time or the process chamber pressure, or a combination of both when a different photoresist material is used. Other photoresist materials which are contemplated include vinylics having aromatic rings, phenol-aldehyde type condensation product, and combinations thereof. However, since these photoresists are organic, and tend to react with oxygen to produce $CO_2$, one skilled in the art should be able to determine the necessary adjustments to the shaping process conditions without undue experimentation. With regard to use of a different reticle substrate material, the selectivity for etching photoresist material relative to the underlying reticle substrate material must be considered. However, if the underlying substrate layer is an inorganic material which is not reactive with oxygen species, no etch selectivity issue may arise. Further, when an organic ARC is used beneath the photoresist, it may be advantageous to have this organic ARC removed from the reticle substrate surface during the photoresist shaping process.

After the surface of a patterned photoresist layer is reshaped, fabrication of a reticle may be completed by transferring a pattern from the reshaped photoresist through the layer of antireflective material and underlying layers of material to at least the upper surface of a substrate material which forms the continuous bottom layer of the reticle. The process conditions used for transferring the pattern through each underlying layer of material will depend on the underlying material and the selectivity for etching the reshaped patterned photoresist relative to a given underlying layer. Frequently one skilled in the art will find recommended process conditions are provided by the etch tool manufacturer. In the present instance, the dry etch process conditions used to transfer the pattern through the $CrO_xN_y$ ARC layer and the underlying chrome layer were as follows: The etch chamber pressure was about 6 mTorr; the plasma source gas was a combination of 17 sccm of $O_2$, 50 sccm of $Cl_2$, and 22 sccm of He. With reference to Figure Four, 600 Watts of RF source power at a frequency of 2 MHz was applied to inductive coil 434, and 5 Watts of RF bias power 430 at a frequency of 13.56 MHz was applied to the cathode 410 beneath the reticle substrate 420. Application of bias power 430 produced a substrate DC bias of about −45 to −55V; the reticle structure temperature during etching of the $CrO_xN_y$ ARC layer and underlying chrome mask layer was about 25° C. and the temperature of the etch chamber walls was about 40° C. The etch time was approximately 250 seconds.

It is difficult to do the metrology which indicates whether a patterned photoresist will provide a desired reticle critical dimension when a foot is present at the base of the patterned photoresist. The metrology is particularly inaccurate since the size of the foot typically varies at different locations across the reticle fabrication structure.

Metrology may be carried out after patterning of the photoresist or may be carried out after the pattern has been transferred through the chrome-containing masking layer. Conducting the metrology after patterning of the photoresist assists in providing better resolution, as etch conditions used in subsequent pattern transfer can be adjusted to provide better resolution. In instances where the photoresist pattern is defective, the significant cost of transferring a defective pattern from a patterned photoresist through several underlying layers can be avoided by conducting metrology after patterning of the photoresist.

Reshaping of the surface of a patterned photoresist to remove "t" topping, standing waves from the patterned surface, and to remove a foot at the base of the patterned photoresist makes it possible to accurately conduct metrology after patterning of the photoresist. As described above, this provides a substantial savings in the manufacture of reticles, as the metrology can be used to determine, where in the integrated process, dimensional error occurs, indicating which process step variables require adjustment to enable the production of a satisfactory reticle. Further, the metrology may also be used to determine which reticles are defective after photoresist patterning, so that these reticles may be discarded without the investment of further processing time and materials. Finally, possibly even more valuable is the improved resolution in the patterned mask itself when the pattern distortions in the photoresist are removed by anisotropic shaping of the photoresist rather than subsequently from the underlying chrome masking layer using an isotropic process.

The above described preferred embodiments are not intended to limit the scope of the present invention, as one skilled in the art can, in view of the present disclosure, expand such embodiments to correspond with the subject matter of the invention claimed below.

We claim:

1. An apparatus used in reshaping a surface of a patterned photoresist, the apparatus comprising:
   a) a memory that stores instructions applicable to reshaping a surface of a patterned photoresist, wherein said reshaping includes removing standing waves from a surface of said patterned photoresist, or removing at least a portion of a foot which is present at an interface between said patterned photoresist and an underlying substrate, or removing a "t" top from an upper surface of said patterned photoresist, or a combination thereof;
   b) a processor adapted to communicate with said memory and to execute the instructions stored by said memory;
   c) a plasma processing chamber adapted to carry out said reshaping of said surface of said patterned photoresist in accordance with instructions from said memory; and
   d) a port adapted to pass communications between said processor and said plasma processing chamber.

2. An apparatus in accordance with claim 1 wherein said stored instructions comprise:
   a) a process step in which oxygen-comprising species are accelerated with the directionality normal to a surface of said patterned photoresist; and
   b) timing of said process step so that at least 100 Å is removed from portions of said photoresist surface, whereby standing waves present on said surface of said photoresist are reduced or removed, or at least a portion of any foot present at an interface between said photoresist and an underlying layer is reduced or removed, or a "t" top is removed from an upper surface of said photoresist, or a combination of these surface adjustments is achieved.

3. An apparatus in accordance with claim 2, wherein said instructions which enable accelerating of oxygen-comprising species in a direction normal to a surface of said patterned photoresist are applicable to reshaping of a patterned surface of a chemically amplified photoresist.

4. An apparatus in accordance with claim 3, wherein said instructions are applicable when said chemically amplified photoresist is a chemically amplified DUV photoresist.

5. An apparatus in accordance with claim 4, wherein said chemically amplified photoresist is selected from the group consisting of vinylics having aromatic rings, phenol-aldehyde type condensation product, ether acetate in combination with modified phenolic polymer, and combinations thereof.

6. An apparatus in accordance with claim 1, wherein instructions from said memory provide for separate power application for plasma generation and for biasing said photoresist surface during anisotropic etching used in said reshaping of said surface of said patterned photoresist.

7. An apparatus in accordance with claim 3 or claim 4 or claim 6, in which said instructions provide for control of a pressure in a process chamber in which said photoresist surface reshaping takes place over a pressure range from 1 mTorr to 50 mTorr.

8. An apparatus in accordance with claim 3 or claim 4 or claim 6, in which said instructions provide for control of a substrate temperature, where said substrate includes said patterned photoresist surface, at a temperature ranging between about 5° C. and about 50° C.

9. An apparatus in accordance with claim 1, where said memory, in addition to storing said instructions for reshaping a surface of a patterned photoresist, also stores instructions for patterning of layers underlying said patterned photoresist.

10. An apparatus in accordance with claim 9, wherein said layers underlying said patterned photoresist include a layer of antireflective material.

11. An apparatus in accordance with claim 10, wherein said layers underlying said patterned photoresist include a chrome-containing layer.

* * * * *